United States Patent [19]

Feigenbaum et al.

[11] Patent Number: 5,378,982
[45] Date of Patent: Jan. 3, 1995

[54] TEST PROBE FOR PANEL HAVING AN OVERLYING PROTECTIVE MEMBER ADJACENT PANEL CONTACTS

[75] Inventors: Haim Feigenbaum, Irvine; John S. Szalay, Corona Del Mar; Blake F. Woith, Orange, all of Calif.

[73] Assignee: Hughes Aircraft Company, Los Angeles, Calif.

[21] Appl. No.: 23,019

[22] Filed: Feb. 25, 1993

[51] Int. Cl.$^6$ .............................................. G01R 1/04
[52] U.S. Cl. ................... 324/770; 324/158.1; 439/67; 439/77
[58] Field of Search .................. 324/158 P, 158 F; 439/66, 67, 77

[56] References Cited

U.S. PATENT DOCUMENTS

| | | | |
|---|---|---|---|
| 3,832,632 | 8/1974 | Ardezzone | 324/158 P |
| 4,571,542 | 2/1986 | Arai | 324/158 P |
| 4,585,727 | 4/1986 | Reams | 430/312 |
| 4,887,030 | 12/1990 | Niki et al. | 324/158 P |
| 5,055,776 | 10/1991 | Miller et al. | 324/158 P |
| 5,177,438 | 8/1991 | Littlebury et al. | 324/158 P |

FOREIGN PATENT DOCUMENTS 58-015245 1/1983 Japan .
2239744A 7/1991 United Kingdom .

*Primary Examiner*—Kenneth A. Wieder
*Assistant Examiner*—Barry C. Bowser
*Attorney, Agent, or Firm*—Elizabeth E. Leitereg; Terje Gudmestad; W. K. Denson-Low

[57] ABSTRACT

A test probe for use in testing a liquid crystal display device includes a rigid carrier block (20) having a lower surface to which is secured a flexible circuit (44) having a free end (50) aligned with the free end (26) of the carrier block. A plurality of projecting probe contact features (54) are integrally formed on traces (56) of the flexible circuit (44) and project from the plane of the flexible circuit adjacent the free end. An elastomeric back-up pad (40) is interposed between the carrier block (20) and the projecting contact features (54). The lower side of the carrier block is recessed (30) and the flexible circuit is pre-formed to the configuration of the recess in which it is mechanically secured by a rigid clamp or pressure bar (60). Conductive traces (56) of the flexible circuit have inner ends (58) bearing electrical contacts (68) for connection to test circuitry. The rigid carrier block (20) is mounted to enable the projecting probe contact features to be pressed against a line of contacts (16) on a display device panel (12) while maintaining a clearance between the aligned free ends of the carrier block (26), elastomer (42) and flexible circuit (50) and the edge (70) of a member (18) that overlies the display panel (12) and extends closely adjacent to and parallel to the row of display panel contacts (16).

12 Claims, 2 Drawing Sheets 5,378,982

TEST PROBE FOR PANEL HAVING AN OVERLYING PROTECTIVE MEMBER ADJACENT PANEL CONTACTS

BACKGROUND OF THE INVENTION

1. Field of the Invention

The present invention relates to the testing of liquid crystal displays and more particularly concerns improved methods and apparatus using flexible circuits with bumps for testing purposes.

2. Description of Related Art

Liquid crystal display devices are being produced in ever increasing numbers, particularly as popularity of the portable lap-top type computer is rapidly growing. The screen of many lap-top computers is a flat liquid crystal display device formed by a device panel having as many as two to five thousand electrically conductive circuit lines extending to the edges of its four sides for connection to input/output display circuitry. A thin flat member overlies the panel and the circuit lines and has outer edges that run parallel to the rows of contacts formed by the ends of the conductive circuit lines. The edges of the overlying thin flat member are positioned closely adjacent the ends of the display device contacts that are defined by the ends of the lines.

As with all electronic device system components, it is desirable to test operability of the liquid crystal display devices before assembly of the computer and before assembly of the display device with its input/output circuitry. Conventional testing employs test cards provided with a number of small blades or needles often formed of a resilient or spring-like tungsten. The blades or needles are mechanically and electrically connected to a test circuit board and act as contacts with the display device to be tested. The needles are mounted with configuration and spacing to enable each needle to individually contact one and only one circuit line of the device under test. Electrical leads extend from the contacts to the outer edge of the board for connecting the probe card to test circuitry. In use the test board with its needles is moved into engagement with ends of lines on the liquid crystal display device. For proper positioning the individual blades or needles must be individually adjusted. This adjustment is accomplished by bending the resilient needles to produce a pattern and spacing to match the existing pattern and spacing of the lead ends of the display device which is to be tested.

Ends of the needles and blades must all fall in the same plane in order to assure that each one makes electrical contact with a conductive trace on the device under test. This is accomplished by bending the blades after they are mounted on the probe card, which is laborious, time consuming and expensive. Even after such adjustment the needles tend to creep back toward their original position so that their adjusted locations are lost. This loss of adjustment also comes about from the pressure of the needles against the device to be tested, aggravated by scrubbing action, where such is necessary or desired to assure penetration of an oxide that may cover circuit lines. As a result, constant maintenance is necessary or the probe cards will not perform their intended function. Even when in proper adjustment the needles cannot compensate for significant differences in planarity of the liquid crystal faces or the conductive line ends, and thus some needles may apply excessive force against the display device, thereby damaging some of the leads. Furthermore, close spacing necessary for testing exceedingly fine pitch lines (0.004 to 0.005 inch pitch for example) cannot be achieved with conventional needle contacts, or, at best, makes the test probes very expensive and susceptible to mechanical damage during testing.

Further, in test of a liquid crystal display panel, the close proximity of the edge of the overlying member to the ends of the conductive lines on the display device define a very small clearance, thus requiring ever more accurate and precise positioning of the needle contacts in order to avoid interference with the edge of the overlying member.

Accordingly, it is an object of the present invention to provide for testing by methods and apparatus that avoid or minimize above mentioned problems.

SUMMARY OF THE INVENTION

In carrying out principles of the present invention in accordance with a preferred embodiment thereof there is provided a test probe having a carrier block with a free end and a lower side. A flexible circuit extending along the lower side of the block has a circuit free end co-terminous with the free end of the carrier block. The flexible circuit includes a plurality of raised features closely adjacent but spaced inwardly of the circuit free end and projecting from the flexible circuit. Means are provided for securing the flexible circuit to the carrier block, and the flexible circuit includes conductors in electrical contact with the raised features for connecting the features to external test circuits.

According to a feature of the invention the carrier block is formed with a depression on its lower surface and a pressure bar forces the flexible circuit into the depression to mechanically lock the flexible circuit to the lower side of the carrier block.

DESCRIPTION OF THE PREFERRED EMBODIMENTS

Although the invention has been initially conceived and constructed for use in testing of liquid crystal display devices, it will be readily understood as the description proceeds that the described methods and apparatus for employing flexible circuits in manufacture and use of test probes are readily adaptable to the testing of many other different types of devices. Nevertheless, to better explain characteristics of the methods and apparatus of the present invention these will be described in connection with an apparatus specifically configured and arranged for testing of a liquid crystal display device.

Figure 1:
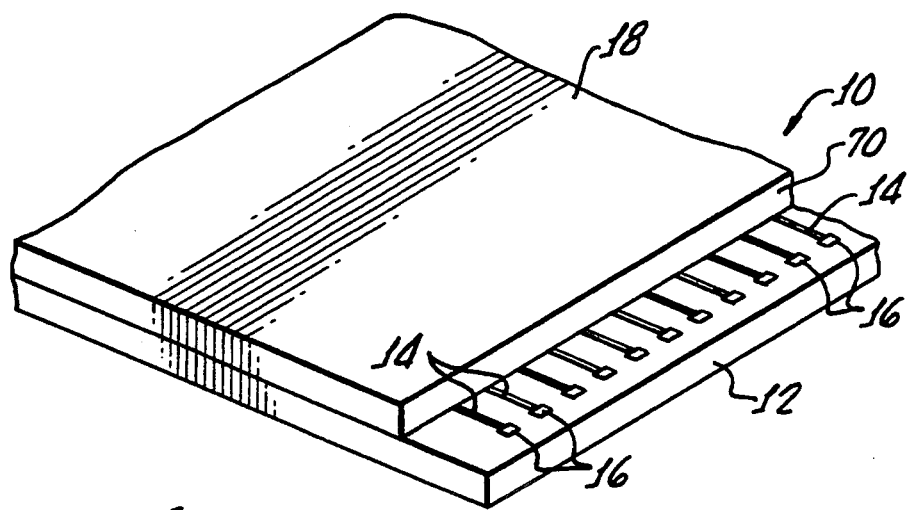
FIG. 1 is a pictorial view of a portion of a liquid crystal display panel showing a line of device contacts and conductive traces positioned closely adjacent an edge of an overlying panel member.

As shown in FIG. 1, a portion of a liquid crystal display device 10 includes a substrate 12 formed with a large number of electrically conductive traces or lines 14 that connect from internal portions of the display device to external circuitry. Although fewer lines are shown for clarity of the drawings, a typical display device may have as many as two to five thousand lines in a space of just a few inches. These traces are brought out to the two or four sides of the rectangularly shaped display device and terminate at trace ends, generally indicated at 16 in FIG. 1. These trace ends may also be termed "display device contacts". A protective device, such as a flat glass member 18, overlies the substrate 12 and traces 14. To test the display device 12, electrical contact must be made with all or at least a group of the device contacts 16 for connection to external test circuitry. To this end there is provided the test probe, shown in FIGS. 2 and 3, that comprises a rigid carrier block 20 of a generally flat rectangular configuration, having a support bar 22 fixedly secured to an inner end thereof for connection to a probe carrying structure 24, which itself is connected to other probe mounting equipment (not shown) that enables motion of the test probe to and from a liquid crystal panel to be tested. The mounting equipment also provides for adjustment of the horizontal position and orientation of the carrier block for precision alignment with the row of device contacts 16.

Formed in an intermediate section of the carrier block, between its outer free end 26 and its inner end 28, is a transverse recess 30 that extends across the entire width of the carrier block, opening downwardly in its lower side. The recess shown is of a generally trapezoidal shape in cross section. However, the sharp corners illustrated, as at 32 and 34 for example, are preferably rounded to some extent to minimize stress in the bending of a flexible circuit that is pressed into the recess.

Adjacent the free end 26 of the carrier block 20 is a second recess 38 formed at the back edge in which is securely mounted, as by adhesive or the like, an elongated resilient soft and compliant elastomeric pad 40 that forms a resilient pressure back-up for probe test contacts, to be described below. The elastomeric pad 40 also has a free end 42 that is in alignment with the free end 26 of the carrier block.

Figure 3:
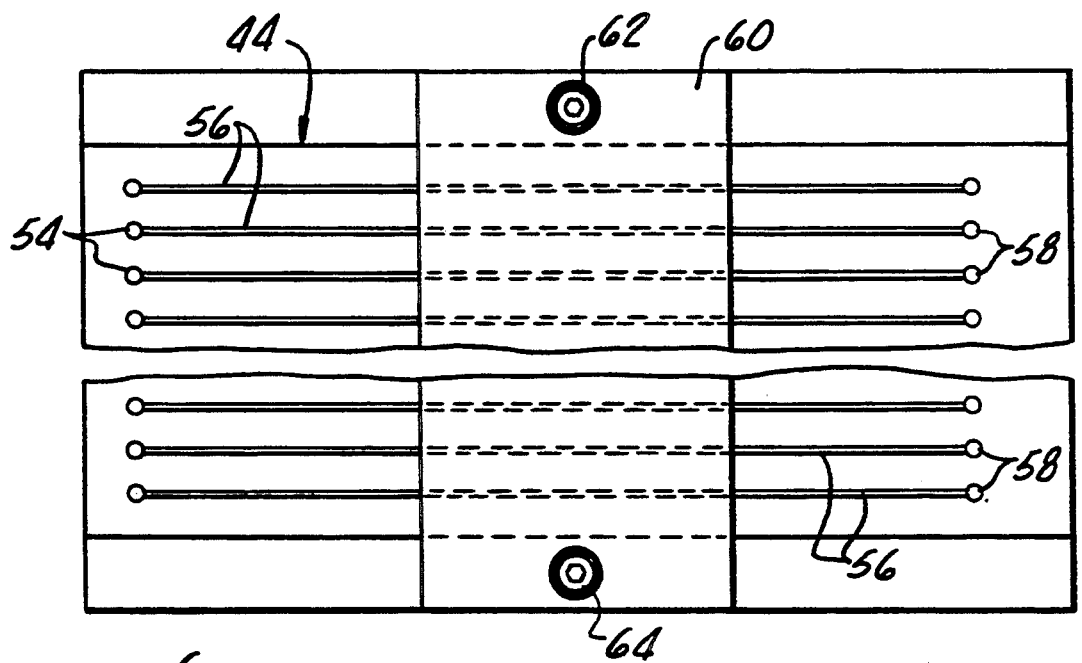
FIG. 3 is a view of the lower side of the test probe.
Figure 4:
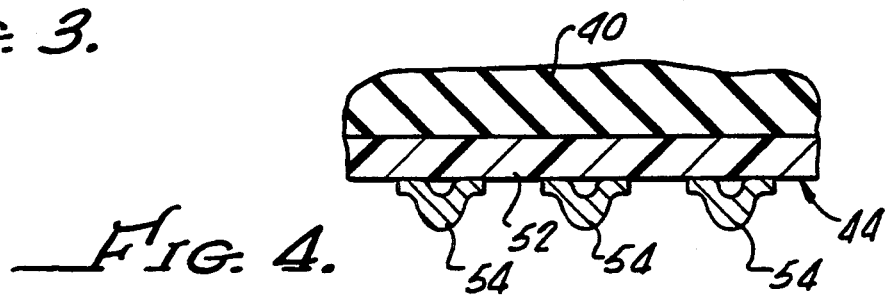
FIG. 4 is an enlarged section of a fragment of a flexible circuit and elastomeric back-up pad utilized in the probe of FIGS. 1, 2 and 3.

A flexible circuit, generally indicated at 44, is secured to the lower side of the carrier block 20 and has a forward free end 50 that is co-terminous with or aligned with the free ends 26 and 42 of the carrier block and elastomeric pad. The flexible circuit may be secured to the lower side of the carrier block 20 in any suitable fashion. Preferably, it is mechanically clamped to the carrier block, as will be described below. The flexible circuit may be made by any one of several well known methods, including a mandrel process. A section of such flexible circuit is illustrated in FIG. 4, which also shows the relation of back-up elastomeric pad 40 after the flex circuit is mounted to the carrier block. The flex circuit comprises a thin flexible film substrate 52 of non-conductive material, such as a polyamide, having projecting features in the form of test contacts or probe bumps 54 formed on conductive traces 56 (not shown in FIG. 4) of the flexible circuit. Individual circuit traces, such as traces 56 (FIG. 3) connect to each of the probe test contacts 54 and extend along the flexible circuit for connection to external circuitry. Additional contacts, such as those indicated at 58, may be formed at the inner end of the flexible circuit (as shown in FIG. 3) for connection to the external test circuitry. The dielectric film substrate 40 is laminated to the conductive traces and to the projecting circuit features or bumps 54.

For use in a test probe for a liquid crystal display device the projecting features may be formed to have a diameter of approximately 0.003 inches at the base and a diameter of about 0.001 inch at the top, projecting approximately 0.003 inches from the plane of the circuit traces. The spacing and configuration of the projecting features 54 of the flexible circuit which define the test probe contacts are formed with a pattern, configuration and spacing that conforms to the pattern, configuration and spacing of the display device contacts 16.

The completed flexible circuit may be simply adhesively secured to the lower side of the carrier block. However, a preferred arrangement for securing the flexible circuit to the carrier block is illustrated in the drawings and comprises in part the transverse depression that is formed in the lower side of the carrier block itself. After the flexible circuit has been completed and removed from the mandrel it is placed on a suitable tool or die having a recess configured the same as the carrier block recess and suitably pressed so as to pre-form the flexible circuit with an inwardly bent depressed portion having a configuration that precisely mates with the configuration of the recess 30 of the carrier block. The flexible circuit is physically and mechanically fixedly secured to the carrier block by means of a pressure bar 60 having a configuration that also mates with the configuration of the recess. Pressure bar 60 extends transversely across the entire width of the carrier block, as seen in FIG. 3. It may be noted that the flexible circuit has a width less than the width of the carrier block so that areas at ends of the pressure bar 60 may receive clamping bolts 62,64, which are threadedly received in the body of the carrier block, to press the pressure bar 60 against the carrier block and thereby fixedly secure the flexible circuit to the carrier block. If deemed necessary or desirable, the flexible circuit can be further secured to the carrier block by the use of suitable adhesive between at least those portions of the flexible circuit and carrier block that are outside of the recess 30.

The inner end of the carrier block has secured thereto, at its lower side, a second pressure bar 64 which presses against the end of a test equipment connection circuit, such as a second flexible circuit 66 having flat contact pads 68. The contact pads 68 of connecting circuit 66 are accordingly pressed against the projecting contacts 58 formed on the inner end of the flexible circuit 44, whereby the test contacts 54 adjacent the free end of the probe are electrically connected via the flexible circuit traces 56, flexible circuit contacts 58 and connecting circuit contact pads 68 to external test equipment (not shown).

Figure 2:
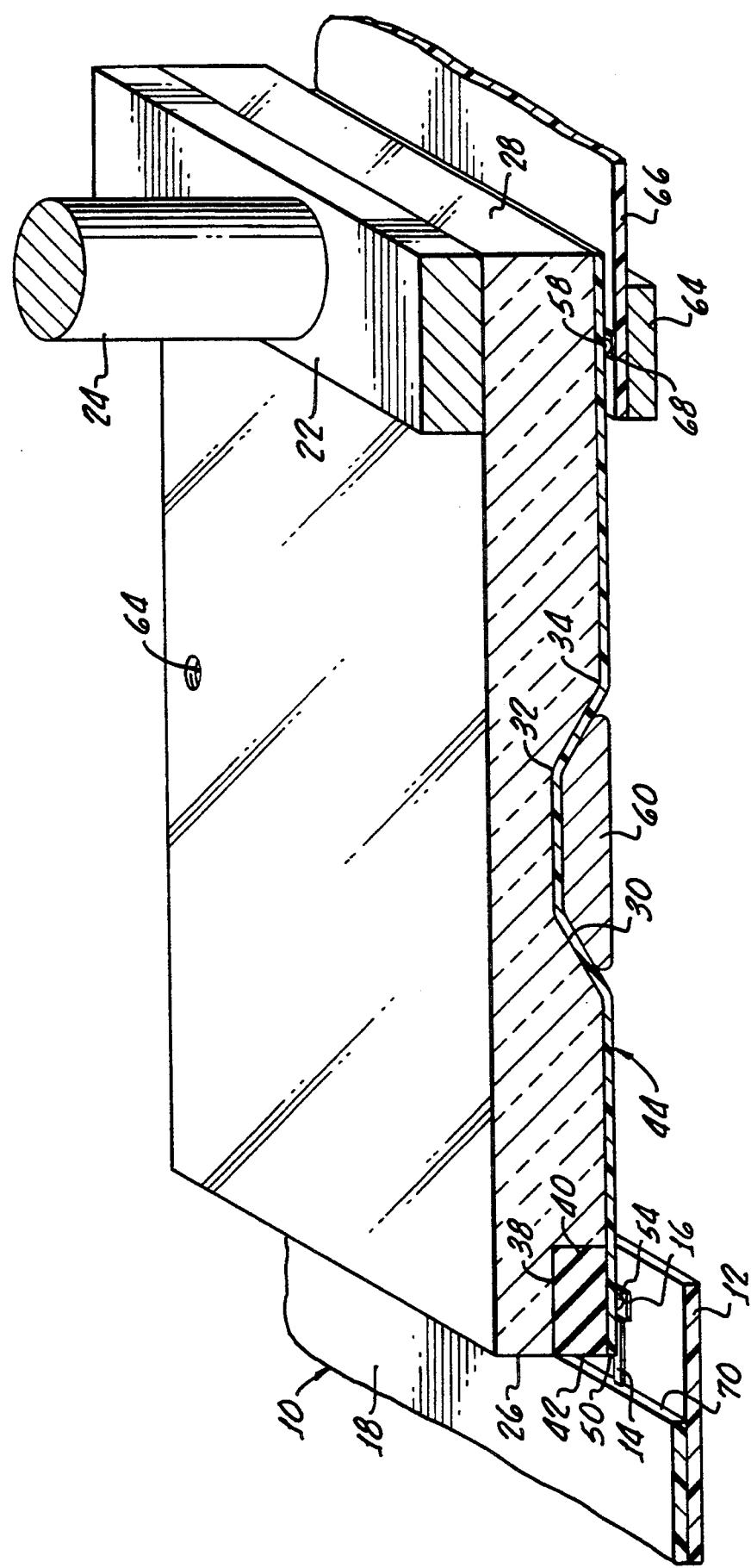
FIG. 2 is a fragmentary pictorial illustration of a test probe embodying principles of the present invention in testing relation with a liquid crystal display panel.

The described clamping recess and pressure bar 60 provide secure mechanical connection of the flexible circuit to the carrier, and yet do not protrude downwardly from the plane of the lower side of the carrier so that clearances may be maintained. Importantly, it may be noted that the raised features or test probe contacts 54 are positioned closely adjacent the mutually aligned free ends of the carrier block elastomeric pad and flexible circuit itself. These free ends extend in alignment in a direction perpendicular to the plane of the flexible circuit so as to maximize the clearance between the test probe and the adjacent free edge 70 of the member 18 that projects above the surface of the display panel upon which the conductive traces 14 are located. The free ends, alternatively, may incline rearwardly (to the right as seen in FIG. 2) to extend at an angle less than 90° (relative to the lower side of the block) to enhance the clearance between the carrier block and the edge 70 of display panel member 18. For example, in a typical liquid crystal display device panel the distance between the edge 70 of overlying member 18 and the row of device contacts 16 may be in the order of about 0.08 to 0.12 inches. Accordingly, it is necessary that the probe contacts 54 be positioned close to the free edge 26,50 of the probe, at a distance of less than about 0.08 inches. In an exemplary embodiment, contacts 54 are spaced inwardly of flexible circuit edge 50 by about 0.060 inches, thus providing clearance between the free edge of the probe and the upstanding edge 70 of overlying member 18. Elastomeric pad 40 has a width of about 0.120 inches and is substantially symmetrical about either side of the row of probe contacts 54 (as viewed in FIG. 2) to provide a relatively even pressure on both sides of all of the probe contacts.

Recess 30 and pressure bar 60 are positioned relatively close to the free end of the flexible circuit to ensure precision of positioning and connection between the free end, or more specifically the probe contacts 54 of the flexible circuit, and the rigid carrier block. Thus, for example, the forward edge of the recess 30 may be about 0.6 inches from the free end of the carrier block.

Importantly, to facilitate visual alignment of the probe contacts 54 and device contacts 16, and to facilitate use of automatic visual alignment equipment, the carrier block, or at least the end portion thereof adjacent its free end, and the elastomer 40 are made of a transparent material. The precise alignment of the free ends of the carrier block, elastomer and flex circuit thus provide a visual line that greatly facilitates visual alignment of the probe contacts with the device contacts. The rigid mechanical connection of the flexible circuit by means of pressure bar 60 to the carrier block at areas adjacent the probe contacts ensures that these will not move laterally (in the plane of the flexible circuit) as might be possible with a connection formed solely by an adhesive material.

In the described arrangement, wherein the flexible circuit is positioned completely along the underside of the carrier block, all of the flexible circuit and its conductive traces and contacts are effectively protected and not exposed to accidental contact with other devices or equipment.

In use of the described flexible circuit test probe the carrier block is positioned by means of the supporting equipment, including elements 22 and 24, with its probe contacts 54 over the line of contacts 16 of the display device. The support structures include mechanisms that enable the probe to be lowered directly upon the display device to cause the probe contacts 54 to contact display device contacts 16. Suitable connections (not shown) between the carrier block 20 and its supporting structure or the supporting structure itself enable lateral adjustment of the carrier block in the plane of the lower side of the block to ensure alignment of and contact between the probe contacts 54 and the display device contacts 16. The transparency of the carrier block and the elastomeric pad and the alignment of the free ends of the several elements of the probe all facilitate final visual alignment of the probe contacts and permit use of automatic visual alignment apparatus.

Elastomeric back-up member 40 applies a resilient pressure from the carrier block downwardly against the upper side of the flexible circuit both in front of and behind the probe contacts 54. This helps to provide a uniform contact over all test contacts and to enable the probe contacts to properly connect with non-planar device contacts. Thus the elastomeric back-up member allows the probe contacts 54 to be displaced vertically relative to one another to accommodate differences in height of the ends 16 of the conductive traces of the display device.

There has been described a test probe particularly adapted to accommodate itself to the very tight clearance distances available for making test contact with the contacts of a liquid crystal panel display device. The arrangement employs a novel configuration of a flexible circuit using projecting test contacts and an improved rigid connection of the flexible circuit to the carrier block.

What is claimed is:

1. A test probe for testing a liquid crystal display device having a substrate with a row of contact pads and a member on said substrate having an edge closely adjacent said row of contact pads, said test probe comprising:
    a carrier block having a free end and a lower side,
    a flexible circuit extending along said lower side of said block and having a circuit free end co-terminous with said free end of said block, said flexible circuit having a plurality of raised features extending in a line parallel to and closely adjacent said circuit free end and projecting from said flexible circuit, said line of raised features being spaced from said circuit free end by a distance less than the distance between said row of contact pads and said edge of said member of the substrate of said liquid crystal display device, and
    means for securing said flexible circuit to said carrier block,
    said flexible circuit comprising a thin flexible dielectric substrate and conductor means in electrical contact with said raised features for connecting said features to external test circuitry.

2. The test probe of claim 1 wherein said carrier block includes a transverse recess having recess walls, said flexible circuit extending along the lower side of said carrier block and along the walls of said recess, and including a clamp block having a configuration that mates with said recess and being positioned in said recess, with said flexible circuit being interposed between the clamp block and the recess walls.

3. The test probe of claim 3 wherein said recess has a predetermined configuration and wherein said flexible circuit has a pre-formed configuration congruent with said predetermined configuration.

4. The test probe of claim 1 including a resilient elastomeric pad interposed between said flexible circuit and the lower side of said carrier block adjacent said free end of the carrier block, said elastomeric pad comprising an elastomeric strip having free end co-terminous with said circuit free end and being substantially symmetrical about said line of raised features.

5. The test probe of claim 4 wherein at least a portion of said carrier block, adjacent said free end thereof, and said elastomer are transparent to facilitate visual positioning of said raised features relative to contact pads of the liquid crystal display device to be tested.

6. The test probe of claim 1 wherein said free end of said block extends at an angle not greater than 90° relative to said lower side.

7. The combination of a liquid crystal display device and a test probe therefor wherein said display device includes:
   a substrate having a row of closely spaced device contacts positioned closely adjacent an edge of the substrate, and
   a member overlying said substrate having an edge extending along said row of contacts and spaced inwardly of said row of contacts by a small distance, and
wherein said test probe comprises:
a carrier block having a free end and a lower side,
a flexible circuit extending along said lower side of said block and having a circuit free end terminating at said carrier block free end, said flexible circuit having a row of raised features closely adjacent said circuit free end and projecting from said flexible circuit,
said row of raised features being spaced inwardly from said circuit free end by a distance less than the distance between said member edge and said row of device contacts,
no portion of said carrier block extending beyond said circuit free end, and
means for securing said flexible circuit to said carrier block,
said flexible circuit including conductor means in electrical contact with said raised features for connecting said features to external test circuitry.

8. The test probe of claim 7 wherein said means for securing said flexible circuit comprises a clamp block connected to the lower side of said carrier block with a portion of said flexible circuit interposed between the carrier block and the clamp block.

9. The test probe of claim 8 wherein said carrier block includes a transverse recess having recess defining surfaces, said flexible circuit extending along the lower side of said carrier block and along the surfaces of said recess, said clamp block having a configuration that mates with said recess and being positioned in said recess with said flexible circuit interposed between the clamp block and the recess surfaces.

10. The test probe of claim 9 wherein said recess has a predetermined configuration and wherein said flexible circuit has a pre-formed configuration congruent with said predetermined recess configuration.

11. A method of testing a liquid crystal display device having a substrate that carries a plurality of closely spaced circuit lines each terminating in a device contact pad closely adjacent an edge of the device to define a row of device contact pads, said display device including a men,her mounted upon said display device substrate and having an edge extending along said row of device contacts and spaced therefrom by a predetermined small distance, said method comprising the steps of:
   forming a plurality of conductive traces on a flexible substrate to provide a flexible circuit having a free end,
   forming a plurality of raised features on said flexible circuit adjacent said free end, each of said features being electrically connected to a respective one of said conductive traces and projecting outwardly of said traces and substrate,
   forming a carrier block having a free end and a lower side,
   securing said flexible circuit to said carrier block with said free end of said carrier block being aligned with the free end of said flexible circuit and with said projecting features extending outwardly of said flexible circuit, and positioning said flexible circuit so that said projecting features are spaced from the free end of said carrier block and flexible circuit by a distance that is less than said predetermined small distance,
   positioning said free ends of said carrier block and flexible circuit adjacent the end of said display device member with said projecting features of said flexible circuit in contact with said device contacts, and
   moving said flexible circuit and carrier block toward said display device to press said raised features against said row of device contacts.

12. The method of claim 11 wherein said step of forming a carrier block comprises forming a transverse recess in said carrier block, wherein said step of forming a flexible circuit comprises pre-forming said flexible circuit with a depressed portion having a configuration that mates with said carrier block recess, and wherein said step of securing said flexible circuit to said carrier block comprises positioning said flexible circuit against the lower side of said carrier block with said flexible circuit depressed portion received in said carrier block recess, and mechanically clamping said flexible circuit depressed portion to said carrier block at said carrier block recess.

* * * * *